US006835605B2

United States Patent
Chen

(10) Patent No.: US 6,835,605 B2
(45) Date of Patent: Dec. 28, 2004

(54) METHOD FOR PROVIDING AND UTILIZING REROUTING RESOURCES

(75) Inventor: Steven Chen, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 143 days.

(21) Appl. No.: 10/267,615

(22) Filed: Oct. 9, 2002

(65) Prior Publication Data

US 2004/0072390 A1 Apr. 15, 2004

(51) Int. Cl.$^7$ ............................................... H01L 21/82
(52) U.S. Cl. .................................... 438/128; 438/129
(58) Field of Search ................................ 438/128, 129

(56) References Cited

U.S. PATENT DOCUMENTS 5,128,737 A * 7/1992 van der Have ............. 257/503
6,362,634 B1 * 3/2002 Jarvis et al. ................ 324/719
6,576,923 B2 * 6/2003 Satya et al. .................. 257/48

* cited by examiner

Primary Examiner—David Zarneke
Assistant Examiner—Scott B. Geyer
(74) Attorney, Agent, or Firm—Tung & Associates

(57) ABSTRACT

A method for selectively providing and utilizing electrical pathway routing resources in a semiconductor device including providing a multi-level semiconductor device which has at least two metallization layers including metal lines for carrying electrical signals, wherein the metal lines include first metal lines provided for electrical communication with a third metal line, and the first metal lines and third metal line provided in a common metallization layer and second metal lines provided for electrical communication with the third metal line through respective vias, the second metal lines and third metal line provided in respective separate metallization layers; and, selectively providing at least one rerouting metal line to provide an alternative electrical pathway from at least one second metal line to the third metal line.

20 Claims, 2 Drawing Sheets

METHOD FOR PROVIDING AND UTILIZING REROUTING RESOURCES

FIELD OF THE INVENTION

This invention generally relates to wafer electrical testing methods and more particularly to an improved method for providing rerouting electric signal connection pathways to provide for an improved signal rerouting methodology during wafer electrical testing (WET).

BACKGROUND OF THE INVENTION

Since the introduction of semiconductor devices, the size of semiconductor devices has been continuously shrinking, resulting in smaller semiconductor chip size and increased device density. One of the limiting factors in the continuing evolution toward smaller device size and higher density has been the increased difficulty of forming high aspect ratio electrical interconnects with sufficient electrical reliability. Wafer inspection and testing methods are typically performed following the formation of various levels in a multi-level device, however many electrical connection defects are frequently missed or are not exhibited until final wafer electrical testing (WET) which is performed to check the electrical functionality of the semiconductor device as a whole as formed on individual wafer die prior to sawing or dicing the wafer into individual die.

For example, in a multi-level semiconductor device there are frequently formed metallization layers that include relatively wide metal areas, for example greater than about 1 micron which are connected to other metallization layers, either overlying or underlying through relatively narrow metal filled holes, also referred to as vias. Frequently, several vias will connect one or more metal interconnect lines in one metallization level to an overlying metallization level including a relatively wide metal area through several vias. The electrical continuity of the various metal interconnects, particularly through the vias is critical to proper functionality of a device.

Copper and copper alloys are increasingly becoming the metallization metal of choice as it has improved electrical resistivity and resistance to electrical migration compared to aluminum, a previously widely used metallization metal. The use of copper, however, has presented several technical manufacturing problems that must be overcome for successful implementation of the technology. For example, copper cannot be successfully etched to form metal lines since it does not form volatile components with known etching chemistries. As a result, copper lines must be formed as metal inlaid structures, also referred to a damascenes or dual damascenes where an anisotropically etched opening is formed in a dielectric insulating layer followed by filling the opening with copper and planarizing the wafer process surface by a chemical mechanical polishing step.

The copper is increasingly deposited according to an electro-chemical deposition process after depositing a copper seed layer according to a PVD or CVD process to provide an electrode surface for copper deposition. In addition, a barrier/adhesion layer is typically deposited to line the anisotropically etched opening prior to copper deposition to prevent the diffusion of copper through silicon oxide based dielectric insulating layers. Following copper deposition, a chemical mechanical polish (CMP) process is performed to remove excess copper and planarize the process surface in preparation for the formation of overlying layers.

Several problems with copper semiconductor processing technology may act to cause open electrical signal pathways to occur, particularly in relatively narrow vias that electrically connect metallization layers. For example, with respect to relatively wide metal areas, for example greater than about 1 micron, CMP processes tend to preferentially cause dishing of the copper area where it is slightly depressed with respect to the plane of a surrounding oxide area. As a result, subsequent formation of an overlying via may result in an open electrical signal pathway. Other problems affecting via interconnections are believed to be related to galvanic erosion effects during the CMP process where a partially exposed barrier/adhesion barrier layer at the process surface forms in the presence of copper a galvanic cell leading to preferential erosion of the copper area with the similar result that a via formed overlying the eroded or depressed area may result in an open electrical signal pathway. Yet another phenomenon believed to cause electrically open pathways is related to exposing the copper to high temperatures during subsequent processing steps which may lead to the formation of copper protrusions at copper surface areas underlying via formation, which through subsequent thermal expansion and contraction of the copper, may lead to a discontinuous electrical signal pathway to the overlying via.

For example, referring to FIG. 1A is shown the relationship of metallization layers in a multi-level (layer) semiconductor device showing only the metallization layer portions for simplicity. For example the multi-level device includes for example $M_n$ metallization layer 12 including relatively wide metal line 18A electrically connected to a relatively narrow metal line 18B. Metallization layer 14 e.g., overlying. metallization layer $M_n+1$ includes metal lines e.g. 16A, 16B, and 16C electrically connected to metal line 18A through metal filled vias, for example copper vias, 17A, 17B, and 17C, respectively. Referring to FIG. 1B is shown a view of a cross section indicated by line A through metal line 16C shown in FIG. 1A. Shown on the surface of metal line 18A, for example copper metal line in metallization layer 12, is humped portion 18C underlying via 17C, for example a copper filled via, the hump being attributed, for example, to a manufacturing process defect in forming copper line 18A. The humped portion 18C may lead to an electrically open signal pathway, for example following subsequent manufacturing processes causing thermal expansion and contraction.

According to the prior art, during WET testing, electrical signals are passed through the various electrical interconnects by means of an automated probe system which sequentially applies an electrical signal to various parts of the wafer surface in an effort to determine the electrical signal pathway integrity of the semiconductor device and provide for signal routing maps for subsequent wiring and packaging processes.

One problem according to the prior art is that there are a limited number of metal lines or electrical signal pathways within the device through which a signal may be passed, also referred to as routing resources. A problem with prior art WET methods is that frequently, in the event one or more via electrical connection pathways fail or open, is the limited ability to reroute an electrical signal due to limited routing resources.

For example, referring to FIG. 1A, in the event via connection 17B fails due to an electrical open, rerouting of the electrical signal pathway through metal line 16B to wide metal line 18A would be impractical with the routing resources shown, requiring the use of other scarce routing sources not shown.

There is therefore a need in the semiconductor manufacturing art to develop an improved method for wafer electrical signal rerouting including wafer electrical testing such that routing resources are increased to provide for improved rerouting options for more improved electrical testing and operation of a semiconductor device.

It is therefore an object of the invention to provide an improved method for wafer electrical signal rerouting including wafer electrical testing such that routing resources are increased to provide for improved rerouting options for more improved electrical testing and operation of a semiconductor device while overcoming other shortcomings of the prior art.

SUMMARY OF THE INVENTION

To achieve the foregoing and other objects, and in accordance with the purposes of the present invention, as embodied and broadly described herein, the present invention provides a method for selectively providing and utilizing electrical pathway routing resources in a semiconductor device.

In a first embodiment, the method includes providing a multi-level semiconductor device including at least two metallization layers having respective metal lines for carrying electrical signals. The metal lines including first metal lines provided for electrical communication with a third metal line where the first metal lines and third metal line are provided in a common metallization layer and second metal lines are provided for electrical communication with the third metal line through respective vias. The second metal lines and third metal line are provided in respective separate metallization layers where at least one rerouting metal line is selectively provide to form an electrical pathway from at least one second metal line to the third metal line.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention is explained with respect to exemplary copper metallization layers and copper interconnect lines, it will be appreciated that the method of the present invention while particularly advantageous in providing alternate electrical pathways in the case of vias connecting metal interconnect lines from one metallization layer to another metallization layer including a relatively wide metal area, it will be appreciated that the method of the present invention is applicable in general to any kind of metal line and to any pattern of conductive interconnect lines forming electrical pathways where alternative electrical pathways are advantageously selectively provided to increase and optimize electrical routing resources (electrical pathways) for the purposes of improved operating of a semiconductor device in the case of via failure.

In a first embodiment of the present invention, dummy metal lines (rerouting lines) are selectively provided to provide alternative electrical communication pathways for metal lines provided for electrical communication with a second metal line through respective vias in the case of an electrically discontinuous electrical pathway.

In a preferred embodiment the first metal lines are connected to the relatively wider second metal line through respective vias. For example, the first and second metal lines including the dummy line is formed of copper or an alloy thereof. The second metal line and has a width or dimension which may cause a humping effect.

In another embodiment, a wafer electric testing process is carried out to determine the electrical continuity and location of metal lines including the first metal lines. After determining electrical discontinuous pathways for the first metal lines the electrical communication pathways are sequentially rerouted to the second metal line including using the dummy lines (rerouting lines) provided according to preferred embodiments.

Figure 1A:
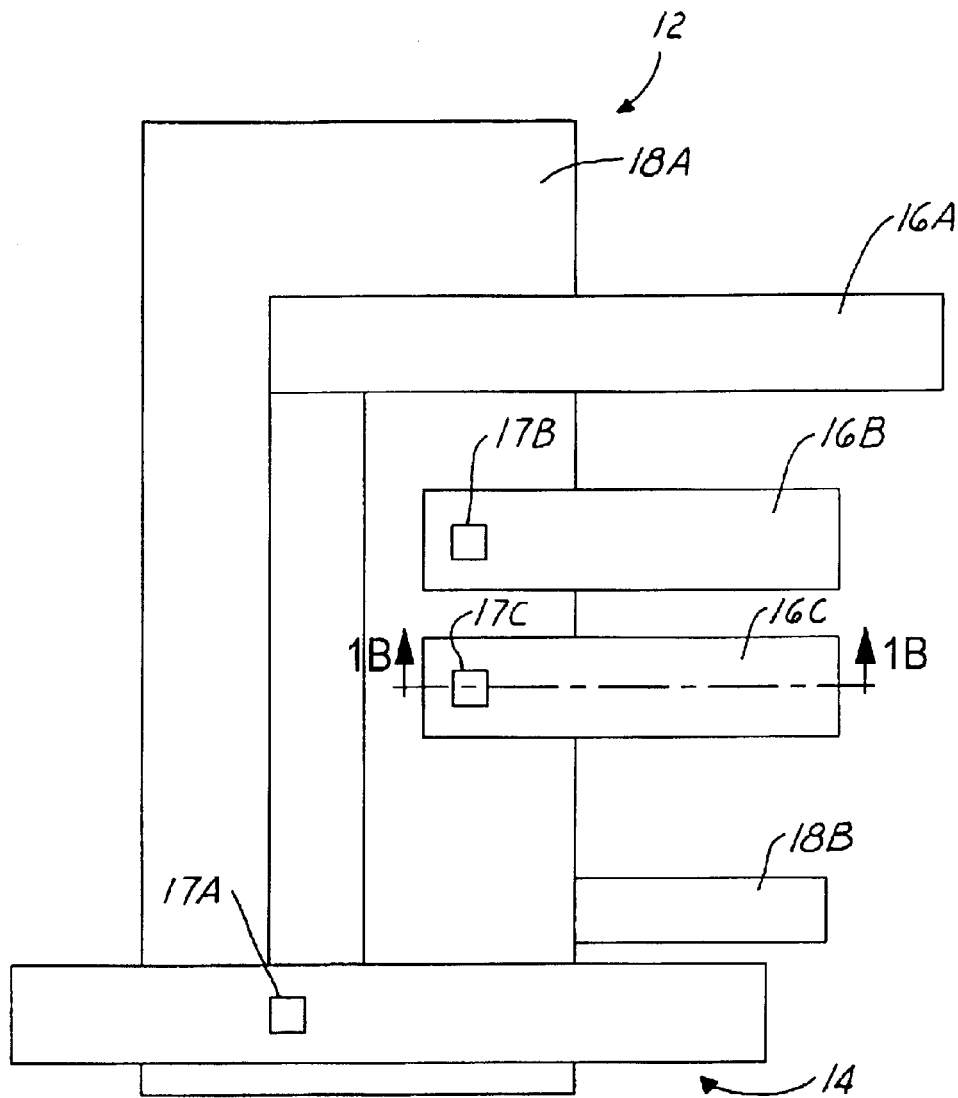
FIG. 1A is a top view conceptual representation of metallization layers including metal lines electrically connected through vias in a manner according to the prior art.
Figure 1B:
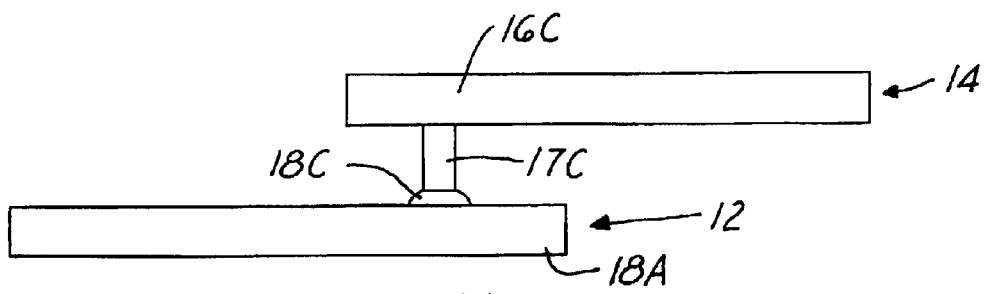
FIG. 1B is a cross sectional view through a section of FIG. 1A showing a via connection likely to result in an open electrical signal pathway according to the prior art.
Figure 2:
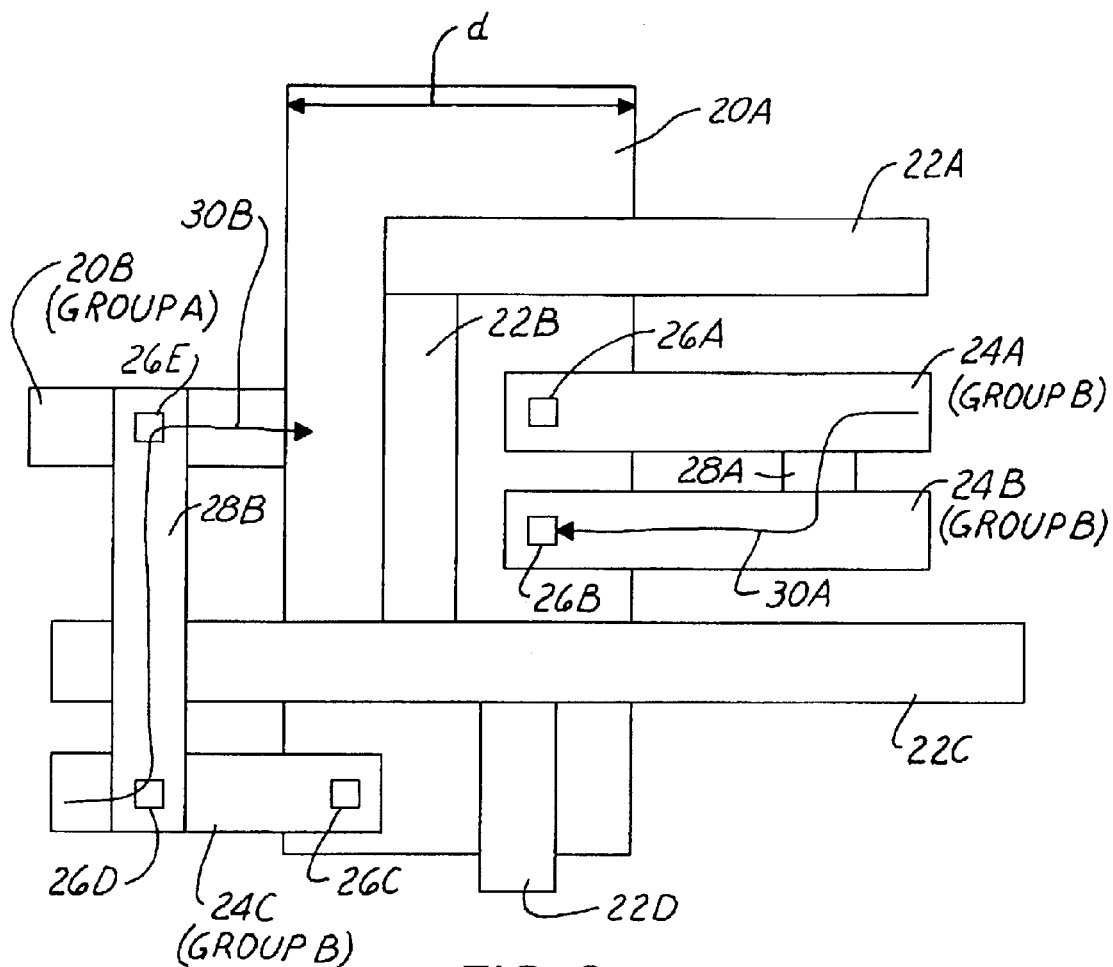
FIG. 2 is a top view conceptual representation of metallization layers including dummy metal rerouting lines provided according to an embodiment of the present invention.

For example, referring to FIG. 2 is shown a top view schematic representation of metallization lines associated with different metallization layers. For example, first metallization layer $M_n$ is shown including a wide metal line 20A, for example having a width d of greater than about 1 micron, electrically connected to a relatively narrower metal line 20B. Overlying metallization layer $M_n$ is metallization layer $M_n+1$ which includes several contiguous metal lines e.g., 22A, 22B, 22C, 22D which are electrically connected to one another and non-contiguous metal lines 24A, 24B, and 24C which are electrically connected to wide metal line 20A in layer $M_n$ by via interconnects 26A, 26B, and 26C respectively. Metal lines having an electric connection through via interconnects to wide metal line 20A are hereinafter referred to as Group B lines. Metal lines that electrically connect to the wide metal line 20A in a common metallization layer including e.g., metal line 20B are hereinafter referred to as Group A lines.

According to an exemplary embodiment of the present invention dummy metal lines (rerouting lines) are provided to provide an alternate electrical pathway to wide metal line 20A by electrically connecting one or more Group B lines to provide an alternate electrical pathway including one or more Group B lines and/or one or more Group A lines. For example, dummy metal line 28A is provided to electrically connect metal lines 24A (Group B) and 24B (Group B) and dummy metal line 28B is provided to electrically connect metal interconnect lines 24C (Group B) and 20B (Group A). For example, with respect to Group B metal lines 24A and 24B, the dummy metal line 28A is provided in a common metallization layer, e.g., $M_n+1$. In this configuration, the alternative electrical pathway to wide metal line 20A is from metal line 24A through dummy line 28A, then through metal line 24B, and finally through via 2GB to metal line 20A as indicated by directional arrow 30A. It will appreciated that Group B lines may also be interconnected with a dummy metal line provided in a different metallization layer through respective vias and electrically connected to Group B lines through a second set of respective via interconnects.

In another exemplary configuration, Group B lines may be electrically connected to wide metal line 20A by providing an alternate electrical pathway through Group A lines. For example, an alternative electrical pathway to wide metal line 20A is achieved by providing dummy line e.g., 28B in a different metallization layer e.g., overlying layer Mn+2. In this configuration, the alternative electrical pathway includes, for example, an electrical pathway from metal line 24C to dummy line 28B through via 26D, then to metal line 20B through via 26E, and finally to wide metal line 20A as indicated by direction arrow 30B.

Preferably, the dummy metal lines are provided in parallel with the formation of metal interconnect lines, for example trench lines, in the respective metallization layer. For example, the method of the present invention is advantageously implemented with respect to copper metal lines as Group B type metal lines (electrically connected to a wide metal line through via interconnects) have been found to have a tendency to form open electrical pathways as a result of various semiconductor processing steps in a multi-level semiconductor device including those leading to thermal expansion and contraction of copper areas. In addition, the method of the present invention is advantageously implemented with respect to Group B lines electrically connected to a wide metal line, for example having a width greater than about 1 micron. It has been found that various semiconductor processing related defects including ECD (electrochemical deposition), CMP, and thermal effects leading to via interconnect electrical opens preferentially occur with respect to wide metal lines.

It will be appreciated that the dummy metal lines providing an alternate electrical pathway may be formed of any conductive metal advantageously used in semiconductor processing, including copper, aluminum, and aluminum/copper alloys. It will further be appreciated that the dummy metal interconnects are preferably formed in parallel with the manufacture of other metal interconnect lines including conventional methods such as photolithographic patterning and anisotropic etching, as well as barrier/adhesion layer deposition and metal filling methods including ECD, PVD (physical vapor deposition), and CVD. When the dummy metal lines are provided in a different metallization layer with respect to Group A or Group B metal lines, appropriate interconnect vias are formed in parallel with via formation to interconnect other metallization levels.

In another embodiment of the present invention, after providing the dummy metal lines to provide alternative pathways to a wide metal line, a testing protocol during wafer electrical testing (WET) is performed to determine the location of open circuit metal lines including open circuits caused by via interconnects to wide metal lines and to map alternative electric pathways including through the dummy metal lines. The term "wide metal line" as used herein means metal lines with a metal line width greater than about 1 micron.

In a preferred WET testing protocol, all metal lines that connect to a wide metal line in a common metallization layer are identified i.e., Group A metal lines. Next all metal lines that connect to a wide metal line through via interconnects are identified i.e., Group B metal lines. In a sequential method, using a conventional WET apparatus, a voltage or current (signal) is applied determine the electrical continuity of Group B lines. If electric non-continuity (i.e., electric open) is determined in a group B line, an alternative electrical pathway for rerouting a signal to the wide metal line is determined to include preferentially determining the shortest electrical pathway providing the use of a minimum amount of routing resources including through a dummy metal line provided according to preferred embodiments. By the term "minimum" amount of routing resources" is meant an electrical pathway that is selected in a manner to utilize the least amount of required electrical pathway for rerouting to the exclusion of other required electrical pathways for operating the semiconductor device. Following selection of the shortest alternate electrical pathway using a minimum amount of routing resources to reroute a particular open electrical pathway, the process is then sequentially repeated with respect to other Group B lines. The process of rerouting may optionally be repeated beginning with a different first selected open group B line in the event it is determined an insufficient amount of routing resource is available until an acceptable rerouting map is established.

Figure 3:
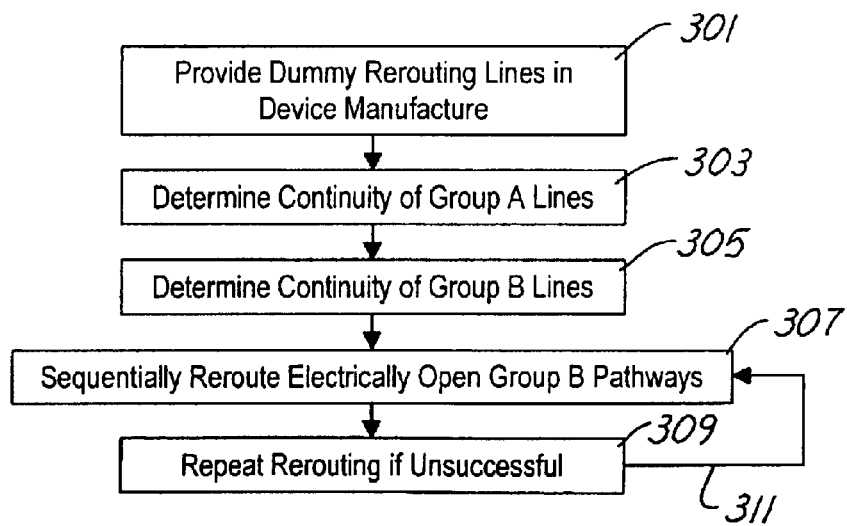
FIG. 3 is a process flow diagram including several embodiments of the present invention.

For example, referring to FIG. 3 is a process flow diagram including several embodiments of the present invention. In process 301, alternative electrical pathways or dummy lines (rerouting lines) are provided according to preferred embodiments in manufacture of a semiconductor device. In process 303 during wafer electrical testing (WET) the electrical continuity and location all Group A lines are determined. In process 305, the electrical continuity and location of all Group B lines are determined including determining open electrical pathways in Group B. In process 307, open electrical pathways determined for Group B lines are sequentially rerouted beginning with a first selected open electrical pathway including finding the shortest electrical pathway using the minimum amount of routing resources including using at least one of dummy lines, electrically continuous Group B lines, and electrically continuous Group A lines. In process 309, if it is determined insufficient routing resources are available to establish all required electric pathways, a second open electrical pathway is selected and process 307 is repeated as indicated by directional process arrow 311.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for selectively providing and utilizing electrical pathway routing resources in a semiconductor device comprising the steps of:

providing a multi-level semiconductor device comprising at least two metallization layers including metal lines for carrying electrical signals, the metal lines comprising first metal lines provided for electrical communication with a third metal line, the first metal lines and third metal line provided in a common metallization layer and second metal lines provided for electrical communication with the third metal line through respective vias, the second metal lines and third metal line provided in respective separate metallization layers; and, selectively providing at least one rerouting metal line to provide an alternative electrical pathway from at least one second metal line to the third metal line.

2. The method of claim 1, wherein the at least one rerouting line is provided in a common metallization layer to electrically interconnect at least two second metal lines.

3. The method of claim 1, wherein the at least one rerouting line is provided in a third metallization layer to electrically interconnect the at least one second metal line and at least one first metal line through respective vias in electrical communication with the at least one rerouting line.

4. The method of claim 3, wherein the third metal line is provided in a second metallization layer, and at least one of the at least one rerouting lines is provided in a third metallization layer.

5. The method of claim 4, wherein the first, second, and third metallization layers are sequentially stacked beginning with the first metallization layer.

6. The method of claim 1 wherein the third metal line comprises a width of greater than about 1 micron.

7. The method of claim 6, wherein the first and second metal lines are relatively narrower compared to the third metal line.

8. The method of claim 6, wherein the metal lines comprise copper or alloys thereof.

9. The method of claim 8, wherein the semiconductor device comprises 0.13 micron line widths.

10. The method of claim 1, further including a wafer electric testing process comprising the steps of:

determining the electrical continuity and location of first and second metal lines; and, sequentially rerouting electrical communication pathways to the third metal line for electrically discontinuous second metal lines including using the at least one rerouting metal line.

11. The method of claim 10, wherein the step of sequentially rerouting comprises sequentially finding alternative electrical pathways for the electrically discontinuous second metal lines such that the alternative electrical pathway selected satisfies the constraints of using the shortest alternative electrical pathway that excludes the fewest required alternative electrical pathway routing requirements to operate the semiconductor device.

12. The method of claim 11, wherein the step of sequentially rerouting further comprises repeating the step of sequentially rerouting beginning with a different electrically discontinuous second line.

13. The method of claim 10, wherein the step of sequentially rerouting comprises sequentially finding alternative electrical pathways for the electrically discontinuous second metal lines such that the alternative electrical pathway selected satisfies the constraints of using the shortest alternative electrical pathway that excludes the fewest required alternative electrical pathway routing requirements to operate the semiconductor device.

14. The method of claim 11, wherein the step of sequentially rerouting further comprises repeating the step of sequentially rerouting beginning with a different electrically discontinuous second line.

15. A method for selectively providing and utilizing electrical pathway routing resources in a semiconductor device comprising the steps of:

providing a multi-level semiconductor device comprising at least two metallization layers including metal lines for carrying electrical signals, the metal lines comprising Group A metal lines provided for electrical communication with a third metal line, the Group A metal lines and third metal line provided in a common metallization layer and Group B lines provided for electrical communication with the third metal line through respective vias, the Group B metal lines and third metal line provided in respective separate metallization layers; and, selectively providing at least one rerouting metal line providing electrical communication between a Group B metal line and at least one of a second Group B metal line and a Group A metal line to provide an alternative electrical pathway to the third metal line.

16. The method of claim 15, wherein the at least one rerouting line is provided in a common metallization layer to electrically interconnect at least two Group B metal lines.

17. The method of claim 15, wherein the at least one rerouting line is provided in a third metallization layer to electrically interconnect the Group B metal line and the Group A metal line through respective vias in electrical communication with the at least one rerouting line.

18. The method of claim 15, wherein the third metal line comprises a width of greater than about 1 micron.

19. The method of claim 18, wherein the metal lines comprise copper or alloys thereof.

20. The method of claim 15, further including a wafer electric testing process comprising the steps of:

determining the electrical continuity and location of first and second metal lines; and, sequentially rerouting electrical communication pathways to the third metal line for electrically discontinuous second metal lines including using the at least one rerouting metal line.

* * * * *